(12) United States Patent
Watanabe et al.

(10) Patent No.: US 8,575,930 B2
(45) Date of Patent: Nov. 5, 2013

(54) MAGNETIC DETECTION DEVICE

(75) Inventors: Masatoshi Watanabe, Kanagawa-ken (JP); Yutaka Yadoumaru, Hyogo-ken (JP); Mitsuru Sugawara, Kanagawa-ken (JP); Aikihiro Kawano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 247 days.

(21) Appl. No.: 13/222,131

(22) Filed: Aug. 31, 2011

(65) Prior Publication Data

US 2012/0062222 A1    Mar. 15, 2012

(30) Foreign Application Priority Data

Sep. 15, 2010 (JP) ................................. 2010-206841

(51) Int. Cl.
*G01R 33/06* (2006.01)
(52) U.S. Cl.
USPC .......................................... 324/251; 324/244

(58) Field of Classification Search
USPC .................................................. 324/251, 244
See application file for complete search history.

(56) References Cited

FOREIGN PATENT DOCUMENTS

JP    2006-153699    6/2006

*Primary Examiner* — Reena Aurora
(74) *Attorney, Agent, or Firm* — White & Case LLP

(57) ABSTRACT

An aspect of the present disclosure, there is provided a magnetic detection device including a magnetic detection unit including a magnetic sensor unit and a comparison unit, the magnetic sensor unit detecting a magnetic flux density, amplifying the detection signal and outputting an output signal to the comparison unit as a mode selected from one of a first mode and a second mode of which power consumption is lower than that of the first mode, the comparison unit comparing the output signal and a reference voltage as a threshold level which determines magnetic field being formed or not, and outputting a comparison result, a conversion gain control unit outputting a mode signal based on the comparison result to the magnetic sensor unit as the second mode when the mode signal is larger than the threshold level or as the first mode when the mode signal is smaller than the threshold level so as to control the magnetic sensor unit.

15 Claims, 16 Drawing Sheets

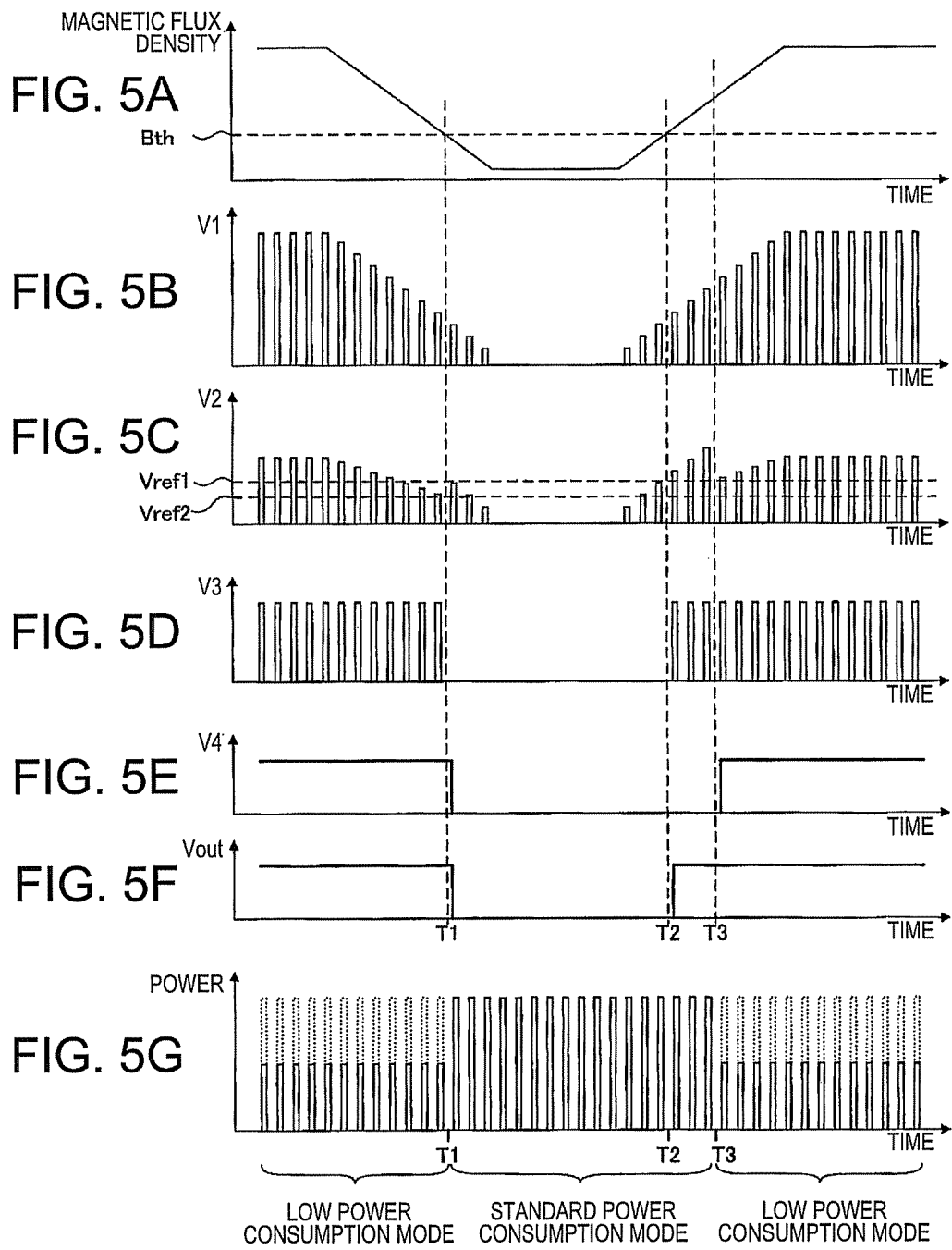

MAGNETIC DETECTION DEVICE

CROSS REFERENCE TO RELATED APPLICATION

This application is based upon and claims the benefit of priority from prior Japanese Patent Application No. 2010-206841, filed on Sep. 15, 2010, the entire contents of which are incorporated herein by reference.

FIELD

Embodiments described herein generally relate to a magnetic detection device.

BACKGROUND

A magnetic detection device includes a Hall element, a voltage amplifier, a voltage comparison circuit and a latch circuit. The Hall element outputs voltage corresponding to strength of magnetic field. The voltage amplifier amplifies the output voltage from the Hall element to output the amplified voltage. The voltage comparison circuit compares the amplified voltage and standard voltage (reference voltage) corresponding to a detection threshold to output an output signal which is processed as a binary signal corresponding to a signal that magnetic field is formed or not. The latch circuit retains the output signal from the voltage comparison circuit. Further, the magnetic detection device can include a switch circuit which inverts polarity of the amplified signal.

The Hall element, a driving circuit and the like in the magnetic detection device are integrated on a silicon chip to be miniaturized. The magnetic detection device is called as a Hall IC in which a method to intermittently operate the Hall element by pulse-driving is often employed for lowering the consumption power.

When electrical current flows in the Hall element and the amplifier of the magnetic detection device as the intermittent operation, the power is largely consumed. On the other hand, the consumption power is suppressed in a case without applying electrical current. In other words, the decrease of the consumption power in the magnetic detection device can be attained just for an amount of an operation duty intermittently decreased.

However, the magnetic detection device has been installed in a digital assistant or the like such as a cell phone, a personal PC, a digital camera, a digital video camera and the like, so that consumption power of the magnetic detection device has been monotonically increased due to high functionalization and high performance. Consequently, the magnetic detection device has been further demanded to lower the consumption power.

BRIEF DESCRIPTION OF THE DRAWINGS

FIGS. 5A-5G are diagrams schematically showing a time dependence of consumption power and operations of the magnetic detection device in the first embodiment;

BRIEF DESCRIPTION OF THE DRAWINGS

Figure 1:
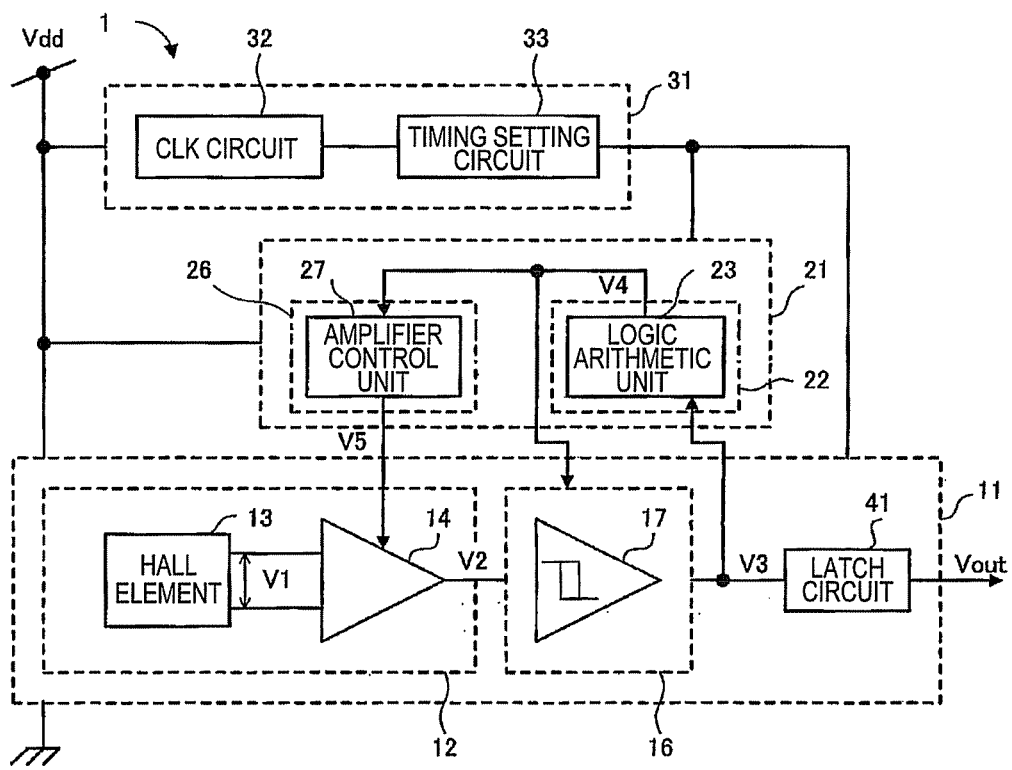
FIG. 1 is a block diagram schematically showing a constitution of a magnetic detection device in a first embodiment.

An aspect of the present disclosure, there is provided a magnetic detection device including a magnetic detection unit including a magnetic sensor unit and a comparison unit, the magnetic sensor unit detecting a magnetic flux density as a detection signal in magnetic field, amplifying the detection signal and outputting an output signal to the comparison unit as a mode selected from one of a first mode and a second mode of which power consumption is lower than power consumption of the first mode, the comparison unit comparing the output signal and a reference voltage as a threshold level which determines magnetic field being formed or not, and outputting a comparison result, a conversion gain control unit including a mode control unit and a magnetic sensor control unit, the mode control unit being input the comparison result and outputting a mode signal based on the comparison result to the magnetic sensor control unit, the magnetic sensor control unit outputting an output signal to the magnetic sensor unit as the second mode when the mode signal is larger than the threshold level or the first mode when the mode signal is smaller than the threshold level so as to control the magnetic sensor unit, and an intermittent operation control unit controlling the magnetic detection unit and the conversion gain control unit to enable to intermittently operate.

Embodiments will be described below in detail with reference to the attached drawings mentioned above. Throughout the attached drawings, similar or same reference numerals show similar, equivalent or same components.

(First Embodiment)

A magnetic detection device according to a first embodiment will be described below in detail with reference to FIGS. 1-5.

As shown in FIG. 1, a magnetic detection device 1 includes, for example, a magnetic detection unit 11, a conversion gain control unit 21 and an intermittent operation control unit 31 which are monolithically integrated on a silicon chip, for example. A power supply Vdd is connected to the magnetic detection unit 11, the conversion gain control unit 21 and the intermittent operation control unit 31. Further, each of the units mentioned above is grounded.

Main constitutions of the magnetic detection device 1 are described below. The magnetic detection unit 11 includes a magnetic sensor unit 12 and a comparison unit 16. The magnetic sensor unit 12 is controlled by a first mode (standard power consumption mode) or a second mode (low power consumption mode) which has lower power than that of the first mode, and intermittently detects and amplifies magnetic field strength (magnetic flux density) so as to output an output signal. The comparison unit 16 compares the output signal of the magnetic sensor unit 12 with a reference voltage (or a standard voltage) corresponding to a threshold level which determines that magnetic field is formed or not, and outputs a comparison result to a latch circuit 41.

The conversion gain control unit 21 includes a logic arithmetic unit 23 in a mode control unit 22 and a magnetic sensor control unit 26. The logic arithmetic unit 23 is continuously input the output signals in a predetermined period, which is represented by a pulse number, from the comparison unit 16 to perform logic arithmetic. The mode control unit 22 outputs a logic arithmetic result. The magnetic sensor control unit 26 controls the magnetic sensor unit 12 to amplify in the standard power mode or the low power mode corresponding to the logic arithmetic result from the mode control unit 22.

The constitution of the magnetic detection device 1 is explained in detail. The magnetic detection unit 11 is constituted with a magnetic sensor unit 12, a comparator 17 and the latch circuit 41. The magnetic sensor unit 12 includes a Hall element 13 and an amplifier 14 which inputs an output signal (V1) from the Hall element 13 to the comparison unit. The Hall element 13 includes four terminals, one pair of the terminals diagonally positioned each other and the other pair of the terminals orthogonally positioned to the one pair of the terminals. In the Hall element 13, electrical current flows between the one pair of the terminals, for example, to generate Hall voltage V1 corresponding to magnetic field strength (magnetic force density) between the other pair of the terminals, so that the Hall voltage V1 can be detected.

Figure 2:
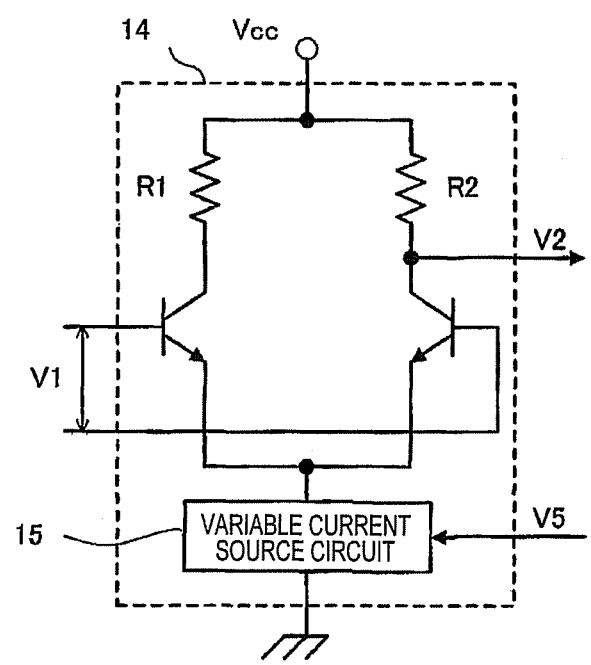
FIG. 2 is a block diagram schematically showing a circuit constitution of an amplifier in the magnetic detection device in the first embodiment.

As shown in FIG. 2, the amplifier 14 is constituted with a differential amplifier having two bipolar transistors which constitutes a differential pair, for example. Each collector of the bipolar transistors is connected to a power supply Vcc via one of a resistor R1 and a resistor R2. Each emitter of the bipolar transistors is grounded via a variable current source circuit 15. The power supply Vcc is supplied from the power supply Vdd. Two terminals inputting Hall voltage V1 are respectively connected to each base of the two bipolar transistors constituting the differential pair. The amplifier 14 amplifies a difference of the input voltage which is a Hall voltage V1 and outputs an output voltage V2 as a difference to ground potential. The variable current source circuit 15 controls electrical current which flows in the two bipolar transistors constituting the differential pair to control gain of the amplifier 14. The variable current source circuit 15 is controlled by a gain control signal V5 output from the amplifier control unit 27 described after. A bipolar transistor is shown, for example, as the amplifier 14 in this embodiment, for example. On the other hand, a MOS transistor can be also applied as another constitution, for example.

Figure 3:
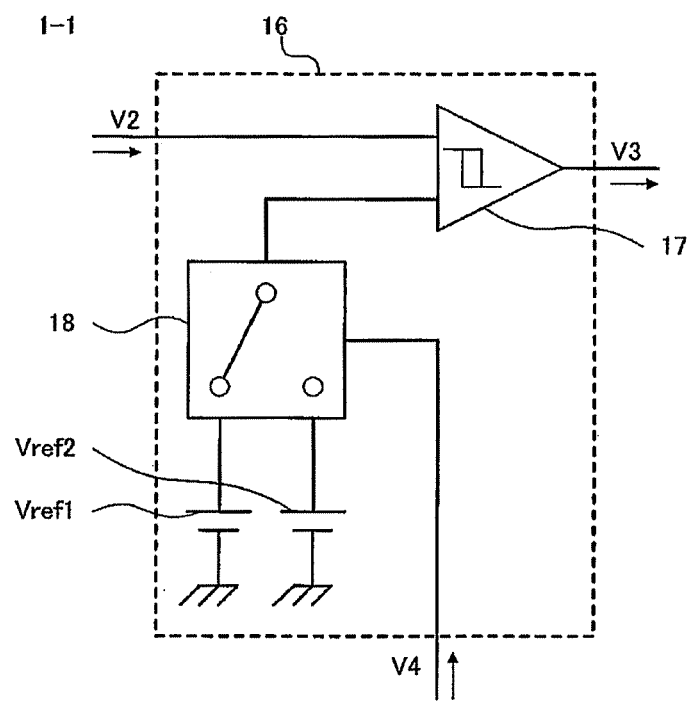
FIG. 3 is a block diagram schematically showing a constitution of a comparison unit in the magnetic detection device in the first embodiment.

As shown in FIG. 3, the comparison unit 16 is constituted with the comparator 17 and a switch 18. The comparator 17 is provided with hysteresis in addition to input characteristics. The switch 18 switches two reference voltages Vref1, Vref2. The output signal V2 of the amplifier 14 is input into the one terminal of the comparator 17, and the reference voltage Vref1 or Vref2 switched by switch 18 is input into the other terminal. The reference voltage Vref1 is corresponding to a threshold level in the standard power consumption mode and the reference voltage Vref2 is corresponding to a threshold level in the low power consumption mode. A value of the reference voltage Vref1 is larger than that of the reference voltage Vref2.

In the standard power consumption mode, the voltage V2 is increased from a lower value to a higher value to be over the reference voltage Vref1 and is shifted to the low power consumption mode in a short time, for example, duration of three pulses. In the low power consumption mode, the voltage V2 is decreased from a higher value to a lower value to be below the reference voltage Vref2 and is shifted to the standard power consumption mode. The switch 18 is switched according to an output voltage V4 of the mode control unit 22. The comparator 17 compares the input voltage V2 with the reference voltages Vref1, Vref2 to output an output signal V3 which is processed as a binary signal corresponding to a signal that magnetic field is formed or not.

The latch circuit 41 includes a retention circuit (not shown), inputs the output signal V3 of the comparison unit 16, and outputs an output signal Vout according to a logic configuration of the latch circuit 41.

The mode control unit 22 in the conversion gain control unit 21 is constituted with the logic arithmetic unit 23 which is input the output signal V3 from the comparison unit 16 and outputs a mode signal V4 corresponding to the standard power consumption mode or the low power consumption mode based on input signals V3 of N times (N means counting number) which is continuously pulsed. Two cases are assumed due to correspondence with the input signal V3 and the output signal V4, for example. One is that "H" is output when high level signals (described "H" hereinafter) of N times are input. The other is that "H" is output when low level signals (described "L" hereinafter) of N times are input.

Figure 4A:
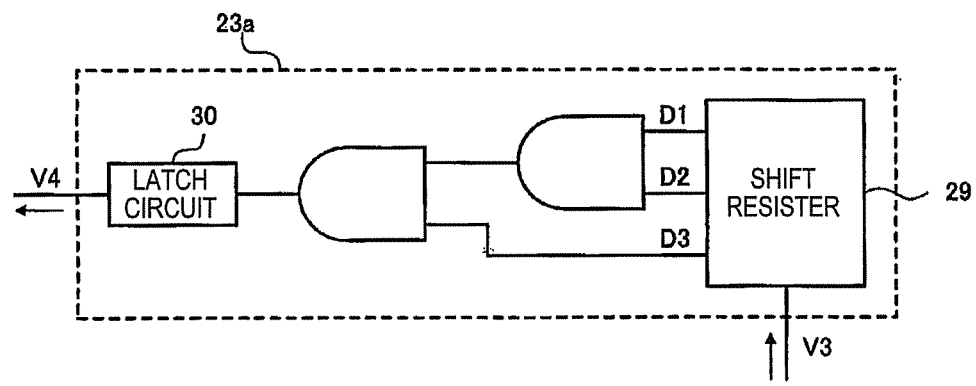
FIG. 4 is a block diagram schematically showing a constitution of a mode control unit in the magnetic detection device in the first embodiment.

As shown in FIG. 4A, the logic arithmetic unit 23a is constituted with a combination of the shift resister 29 and two AND circuits when the number N equals to three, for example. The logic arithmetic unit 23a is designed to switch an output when the output signal V3 of the comparison unit 16 is continuously input the same "H" over three times as converted from "L". The shift resister 29 has three output signals D1, D2, D3, and the two in the output signals D1, D2, D3, for example, are input into an AND circuit of a first step as continuously three times. Both an output of the AND circuit of the first step and another two outputs in the shift resister 29 are input to an AND circuit of a second step, so that the output signal V4 is output via the latch circuit. In this case, the output signal V4 from the logic arithmetic unit 23a becomes "H" when the signal V3 is continuously "H" over three times. On the other hand, the output signal V4 becomes "L" in another case. It is described by using the logic arithmetic unit 23a in this embodiment.

Figure 4B:
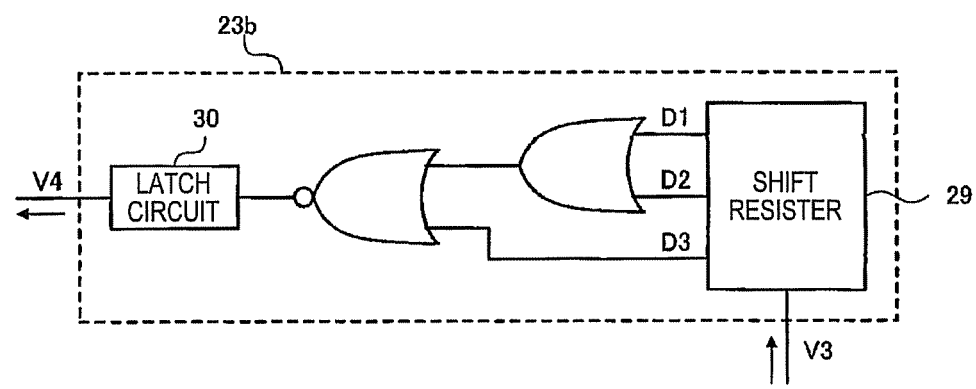

As shown in FIG. 4B, a logic arithmetic unit 23b is constituted with a combination of the shift resister 29, an OR circuit and a NOR circuit when the number N equals to three. The logic arithmetic unit 23a is designed to switch the output when the output signal V3 of the comparison unit 16 is continuously input "L" over three times as converted from "H". The logic arithmetic units 23a, 23b can be corresponded to the output signal V3, "H" or "L", of the comparison unit 16. Further, the logic arithmetic unit 23 can be designed by a combination of logic circuits.

The amplifier control unit 27 outputs a control signal V5 which controls gain of the amplifier 14. The control signal V5 is corresponding to the input signal V4 from the mode control unit 22. When the input signal V4 is "L", the amplifier control unit 27 becomes the standard power consumption mode, so that gain of the amplifier 14 is set up to relatively a higher level. When the input signal V4 is "H", the amplifier control unit 27 becomes the low power consumption mode, so that gain of the amplifier 14 is set up to relatively a lower level.

The intermittent operation control unit 31 includes a clock circuit 32 and a timing setting circuit 33. The clock circuit 32 generates a clock signal. The timing setting circuit 33 divides frequency of the clock signal to output a signal with a prescribed cycle to the magnetic detection unit 11 and the conversion gain control unit 21 which are connected thereto. The magnetic detection unit 11 is intermittently driven based on the frequency of the timing setting circuit 33 (not shown).

Operation of the magnetic detection device 1 is described. As shown in FIG. 5, time is commonly set in the horizontal axis and magnetic flux density, voltage or power is set in the vertical axis with an arbitrary scale. FIGS. 5A-5G show the magnetic flux density applied to the Hall element 13, the output voltage V1 of the Hall element 13, the output voltage V2 of the amplifier 14, the output voltage V3 of the comparison unit 16, the output voltage V4 of the mode control unit 22, the output voltage Vout of the magnetic detection device 1, and the power consumption of the magnetic detection device 1, respectively.

As shown in FIG. 5A, the magnetic flux density of the Hall element 13 is initially set to be a high state. Successively, the magnetic flux density of the Hall element 13 is decreased to be shifted to a low state which is constantly retained, further is increased to be shifted to the high state. When magnetic force of a generation source is constant, the high state indicates the generation source approaches to the Hall element 13, and the low state indicates the generation source separates from the Hall element 13. The magnetic flux density is judged at a threshold level Bth that the magnetic field is applied or not. When the magnetic flux density is in the decreasing state, the time which intersects with the threshold level Bth is defined as T1. When the magnetic flux density is in the increasing state, the time which intersects with the threshold level Bth is defined as T2.

As shown in FIG. 5B, the output voltage (Hall voltage) V1 of the Hall element 13 is intermittently generated corresponding to an intermittent current provided to the Hall element 13, a line which connects between summits of the output V1 (not shown) is corresponding to the magnetic flux density as shown in FIG. 5A. The intermittent current is provided to the Hall element 13 in the cycle controlled by the intermittent operation control unit 31.

As shown in FIG. 5B, the output voltage V2 of the amplifier 14 is amplified along the time axis in an order as the low power consumption mode, the standard power consumption mode and the low power consumption mode. The reference voltages Vref1, Vref2 are pointed out in FIG. 5C. The reference voltages Vref1, Vref2 are used at the comparison unit 16. The reference voltage Vref1 is corresponding to the threshold level Bth in the standard power consumption mode. The reference voltage Vref2 is corresponding to the threshold level Bth in the low power consumption mode. The output voltage V2 has a lower value than the reference voltage Vref2 in the low power consumption mode at the time T1 or immediately after the time T1. Successively, the amplifier 14 is switched to relatively larger gain as the standard power consumption mode and is largely amplified to be output. As shown around the time T1, the output voltage V2 immediately after the time T1 may be shifted to larger value than the value immediately before when switching to the standard power consumption mode.

On the other hand, the output voltage V2 has a higher value than the reference voltage Vref1 in the standard power consumption mode at the time T2 or immediately after the time T2. Successively, when the output voltage V2 is confirmed to be over the reference voltage Vref1 at continuously three numbers T3, the amplifier 14 is switched to the low power consumption mode with a lower gain. As shown around the time T3, the output V2 may be a lower value than the value immediately before when switching the low power consumption mode.

As shown in FIG. 5D, the output voltage V3 of the comparison unit 16 outputs "H" when the output voltage V2 is larger than the reference voltage Vref2 in the low power consumption mode, and the output voltage V2 is lower than the reference voltage Vref1 in the standard power consumption mode.

As shown in FIG. 5E, the output voltage V4 of the mode control unit 22 is switched corresponding to the times T1, T3 which are switching times of the output V2 in FIG. 5C. Namely, a mode control signal of the output voltage V4 becomes "L" in the case of the standard power consumption mode output from the mode control unit 22, and becomes "H" in the case of the low power consumption mode.

As shown in FIG. 5F, the output voltage Vout of the magnetic detection device 1 (latch circuit 41) becomes a signal constantly retained at the latch circuit 41 to the output voltage V3.

As shown in FIG. 5G, the power consumption of the magnetic detection device 1 becomes a value indicated by the real line. The power consumption of the magnetic detection device 1 is the same as a power consumption of a conventional magnetic detection device without conversion gain control unit 21 in the standard power consumption mode. On the other hand, the power consumption of the magnetic detection device 1 becomes a value indicated by the dotted line. The power consumption of the magnetic detection device 1 is lower than that of the conventional magnetic detection device in the standard power consumption mode.

As mentioned above, magnetic detection device 1 includes the amplifier 14 in the magnetic sensor unit 12, the comparison unit 16, the mode control unit 22 and the amplifier control unit 27 in the magnetic sensor control unit 26. The magnetic sensor unit 12 is controlled in the standard power consumption mode or the low power consumption mode, and includes the amplifier 14 which amplifies the strength of magnetic field detected intermittently to output the signal. The comparison unit 16 compares between the output signal from the magnetic sensor unit 12 and the reference voltage corresponded to the threshold level. The comparison unit 16 judges that the magnetic field is applied or not, and outputs the comparison result. The mode control unit 22 performs logic arithmetic based on the output signals continuously output in predetermined period from the comparison unit 16, and outputs the result of the logic arithmetic. The magnetic sensor control unit 26 includes the amplifier control unit 27 which controls the amplifier 14 of the magnetic sensor unit 12 as the standard power consumption mode or the low power consumption mode.

Consequently, the amplifier 14 is amplified with lower power consumption in the low power consumption mode than the power consumption in the standard power consumption mode corresponding to the conventional magnetic detection device. Therefore, the magnetic detection device 1 can be operated by lower power consumption than that of the operation of the conventional standard power consumption mode. Furthermore, in the case of shifting to the low power consumption mode, the value shift is performed after the signal is over the reference voltage corresponded to the threshold level output continuously N number, for example, the number being three. Accordingly, lowering the detection accuracy to the threshold level is suppressed. Since the output signal is amplified in the standard power consumption mode in the case that the magnetic field strength is smaller, the detection accuracy in the conventional case can be retained without change.

(Second Embodiment)

A magnetic detection device according to a second embodiment will be described below in detail with reference to FIGS. 6-7. A different point from the magnetic detection device of the first embodiment is that a magnetic sensor control unit is constituted with a Hall element control unit. Throughout the attached drawings, similar or same reference numerals with the first embodiment show similar, equivalent or same components.

Figure 6:
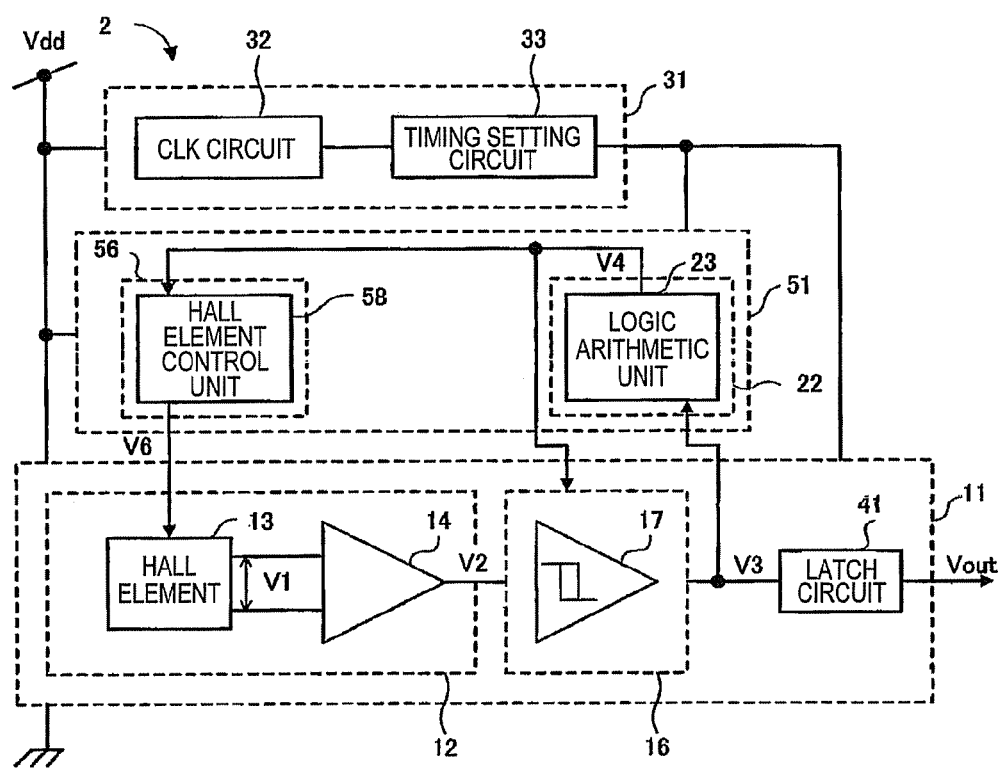
FIG. 6 is a block diagram schematically showing a constitution of a magnetic detection device in a second embodiment.

As shown in FIG. 6, a magnetic detection device includes a Hall element control unit 58 in the magnetic sensor control unit 56. The Hall element control unit 58 output a Hall element control signal V6 corresponding to the input signal V4 from the mode control unit 22, the Hall element control signal V6 controls electrical current and is provided to the Hall element 13. When the input signal V4 is set to be "L", the Hall element control unit 58 is put at the standard power consumption mode. As a result, the input signal V4 is set up that the electrical current provided to the Hall element 13 becomes relatively high. When the input signal V4 is set to be "H", the Hall element control unit 58 is put at the low power consumption mode. As a result, the input signal V4 is set up that electrical current provided to the Hall element 13 becomes relatively low as compared to the standard power consumption mode.

The amplifier control unit 27 disposed in the magnetic detection device 1 is omitted in the magnetic detection device 2. The amplifier 14 is set to operate in a prescribed gain. The constitution of the magnetic detection device 2 other than the Hall element control unit 58 mentioned above is the same as the magnetic detection device 1 of the first embodiment.

Figure 7:
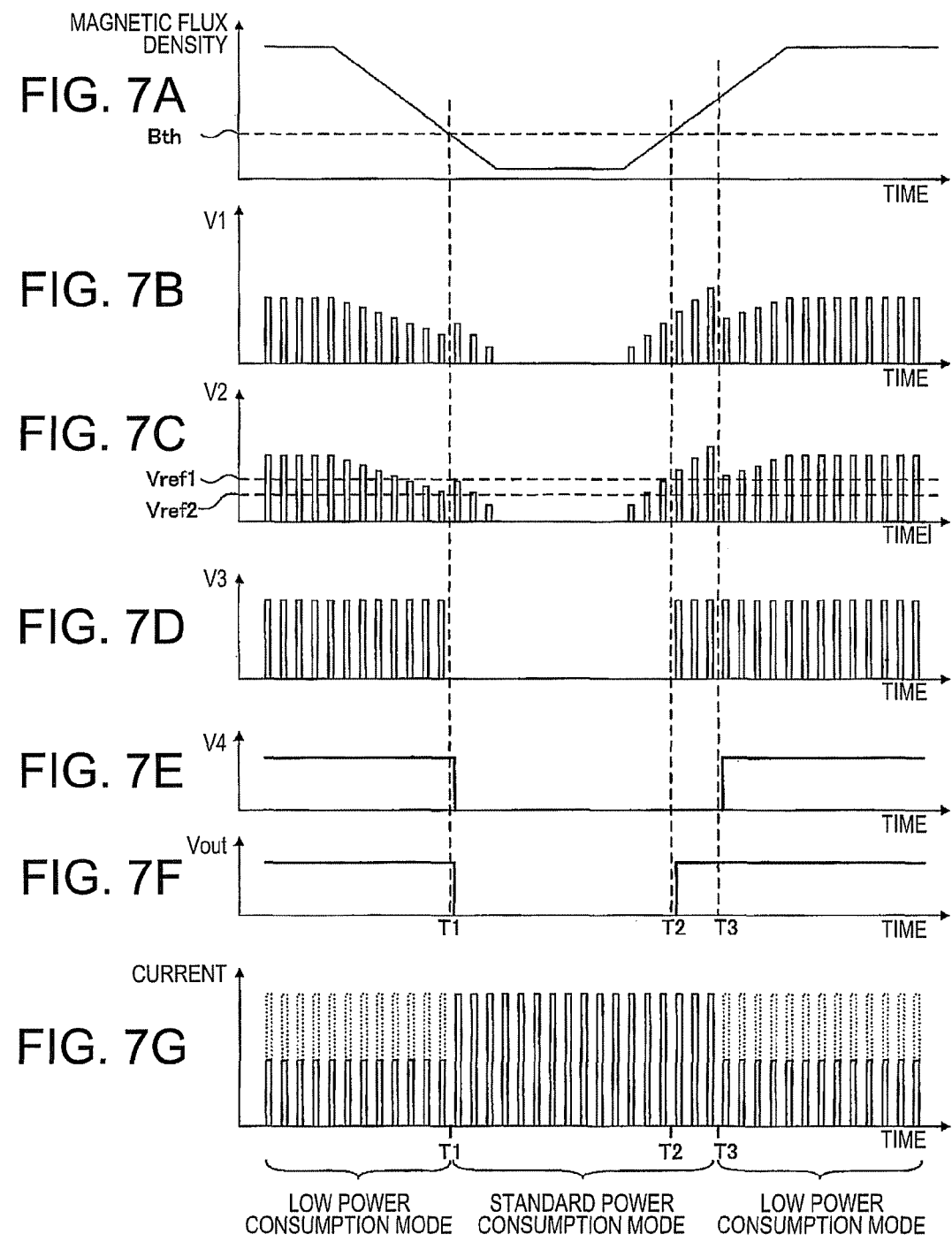
FIGS. 7A-7G are diagrams schematically showing a time dependence of consumption power and operations of the magnetic detection device in the second embodiment.

FIG. 7, as the same as FIG. 5, shows magnetic flux density, voltage and electrical power, each having an arbitrary scale, with respect to a common time axis. As shown in FIG. 7A, the magnetic flux density is the same as FIG. 5A.

As shown in FIG. 7B, when the magnetic flux density is constant, the output V1 of the Hall element 13 can be suppressed lower voltage corresponding to suppressing the electrical current provided to be relatively low in the low power consumption mode. On the other hand, the output V1 of the Hall element 13 can be increased higher voltage corresponding to heightening the electrical current provided to be relatively high in the standard power consumption mode. The output voltage V1 becomes lower than the reference voltage Vref2 at time T1 or immediately after time T1 in the low power consumption mode. Successively, the Hall element 13 is put into the standard power consumption mode. In other words, Hall element 13 is switched to relatively large electrical current to output larger voltage.

On the other hand, the output V1 becomes larger than the reference voltage Vref1 at time T2 or immediately after time T2 in the standard power consumption mode. After the output V1 is confirmed to be over the reference voltage Vref1 in continuously three pulses at time T3, the Hall element 13 is switched to smaller electrical current in the low power consumption mode, and suppresses the output voltage.

As shown in FIG. 7C, the output V2 of the amplifier 14 has a value corresponding to the input V1 as the gain is constant. In other words, the output V2 is corresponding to the shift of the input V1 controlled along the standard power consumption mode or the low power consumption mode prior the one step. Accordingly, the output V2 is shifted as the same in FIG. 5C. In this figure, the reference voltages Vref1, Vref2, which are used in next comparison unit 16, is described.

As shown in FIG. 7D, the output V3 of the comparison unit 16 is carried out based in the reference voltages Vref1, Vref2 as shown in FIG. 7C. FIGS. 7E, 7F are the same as FIGS. 5E, 5F.

As shown in FIG. 7G, power consumption of the magnetic detection device 2 is corresponding to increase or decrease of the consumption current of the Hall element 13, and has a value demonstrated by the real line. The value is the same as a consumption current of a conventional magnetic detection device in the standard power consumption mode, and the value in the lower power consumption mode is lower than the consumption current in the standard power consumption mode.

As mentioned above, the magnetic detection device 2 has the same effect as the magnetic detection device 1, as the electrical current of the Hall element 13 can be controlled as the standard power consumption mode or the low power consumption mode.

The magnetic detection device 2 is demonstrated as the magnetic sensor control unit 56 is constituted with the Hall element control unit 58. On the other hand, the magnetic sensor control unit 56 can includes both the amplifier in the control unit 27 in the magnetic detection device 1 and the Hall element control unit 58.

(Third Embodiment)

A magnetic detection device according to a second embodiment will be described below in detail with reference to FIGS. 8-10. A different point from the magnetic detection device of the first embodiment is that another comparator is added in parallel with the comparison unit to constitute a mode control unit. Throughout the attached drawings, similar or same reference numerals with the first embodiment show similar, equivalent or same components.

Figure 8:
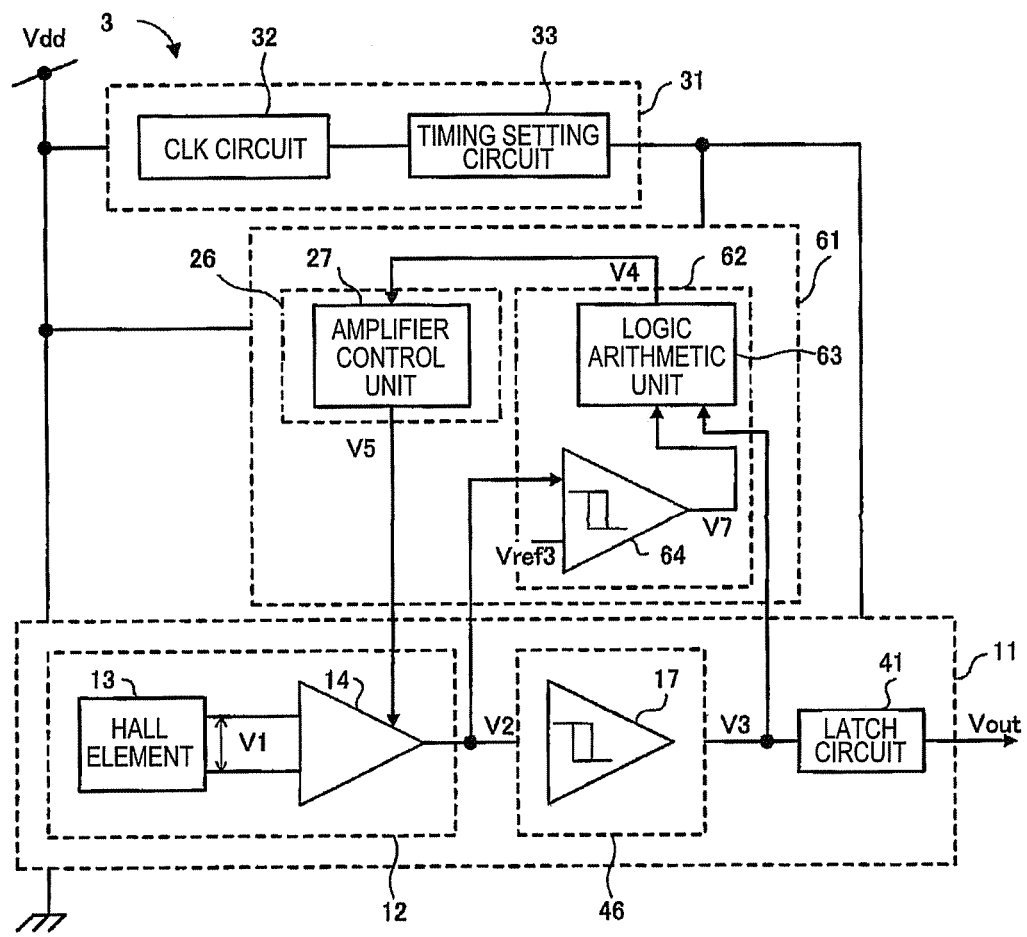
FIG. 8 is a block diagram schematically showing a constitution of a magnetic detection device in a third embodiment.

As shown in FIG. 8, a magnetic detection device 3 is modified from the conversion gain control unit 21 to a conversion gain control unit 61 with respect to the constitution of the magnetic detection device 1 of the first embodiment. In other words, the magnetic detection device 3 includes a mode control unit 62 which includes a comparator 64 and a logic arithmetic unit 63. The output voltage V2 of the amplifier 14 and the reference voltage Vref3 are input to the comparator 64 which outputs the output voltage V7. The output voltage V7 from the comparator 64 is input to the logic arithmetic unit in the conversion gain control unit 61 which outputs an output voltage V4. The comparator 64 is provided with hysteresis in addition to input characteristics as the same as the comparator 17. The comparison unit 46 is fixed to the reference voltage Vref1, for example, as a reference voltage Vref3 is used. The comparison unit 46 is not necessary to use the switch 18. The constitution of the magnetic detection device 3 other than the mode control unit 62 mentioned above is the same as the magnetic detection device 1 of the first embodiment.

The reference voltage Vref3 is corresponding to a larger magnetic flux density B3 than the magnetic flux density of the threshold level Bth mentioned after, and the reference voltage Vref3 is larger than the reference voltage Vref2 corresponding to the threshold level in the low power consumption mode. In the case that the output voltage V2 of the amplifier 14 is gradually decreased in the low power consumption mode, the output voltage V7 of the comparator 64 is compared with the reference voltage Vref3. The output voltage V7 is transferred, for example, from "H" to "L".

Figure 9:
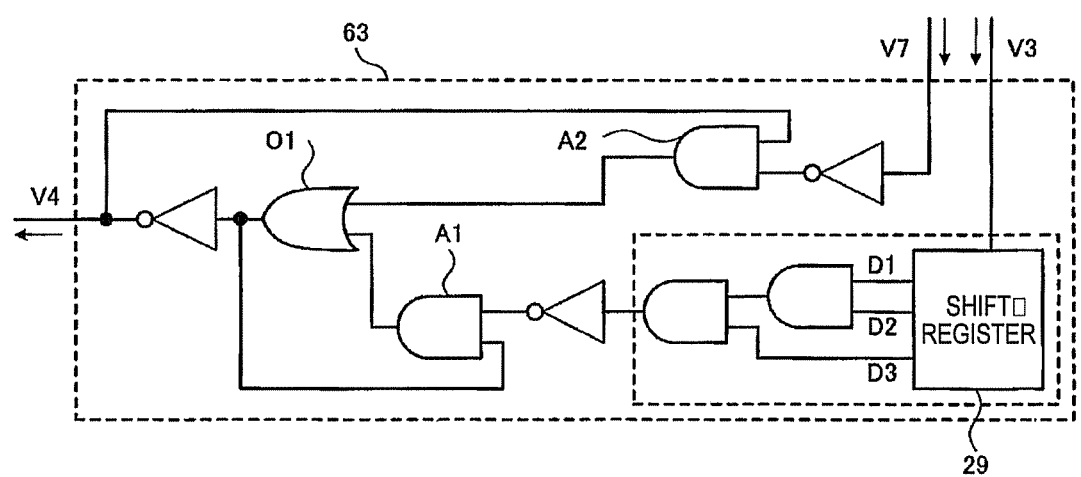
FIG. 9 is a block diagram schematically showing a circuit constitution of a mode control unit in the magnetic detection device in the third embodiment.
Figure 10:
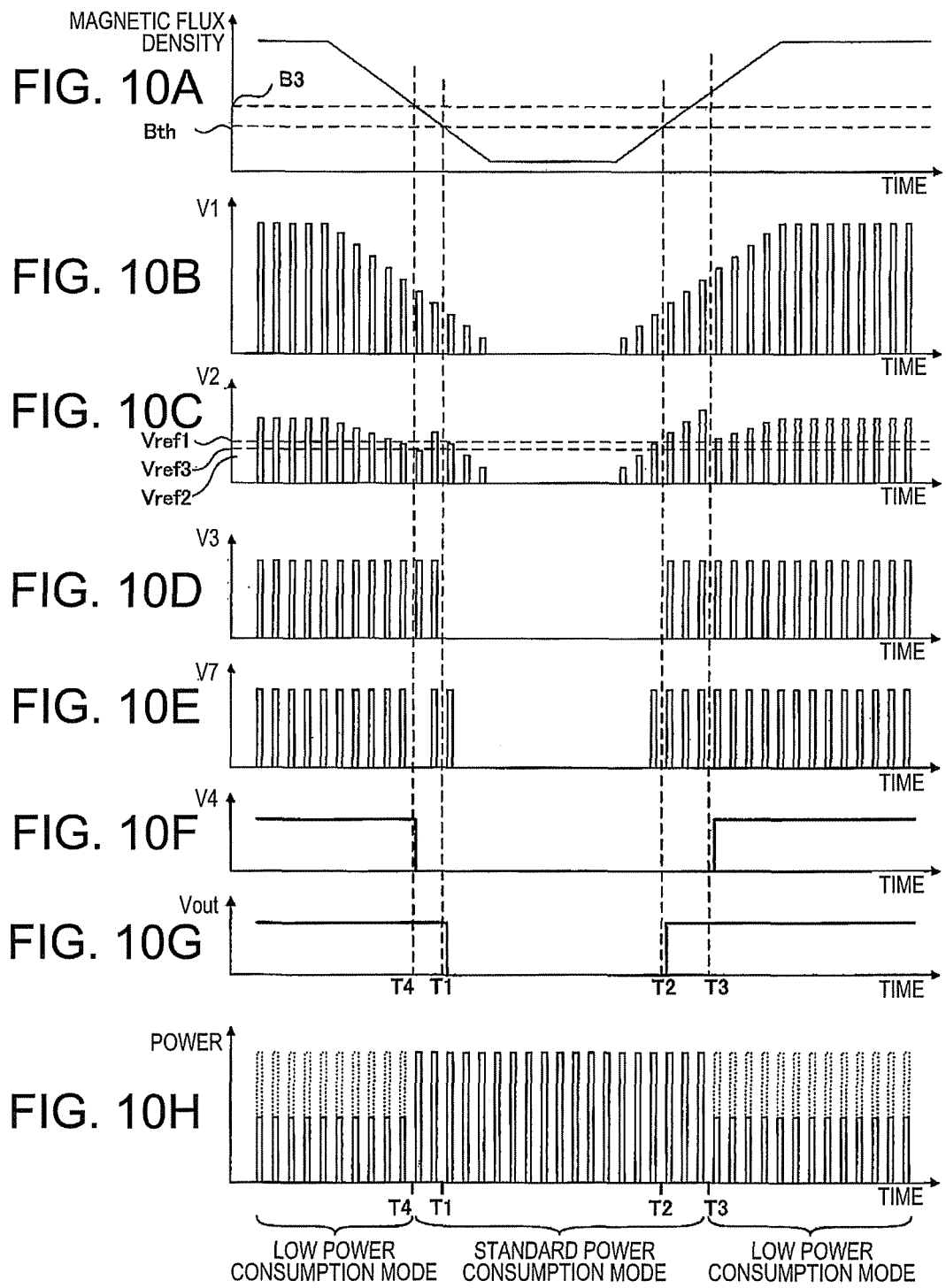
FIGS. 10A-10H are diagrams schematically showing a time dependence of consumption power and operations of the magnetic detection device in the third embodiment.

As shown in FIG. 9, the logic arithmetic unit is constituted with a combination of a shift resister 29, an AND circuit, an OR circuit, an inverter circuit and the like. A portion of the shift resister 29 and the AND circuit surrounded inside the dotted line includes a logic circuit as the same as the logic arithmetic unit 23a.

The output voltage V3 from the comparison unit is input to the logic arithmetic unit 63. An output voltage via the same logic circuit as the arithmetic logic unit 23a is input into one of the AND circuit A1 via the inverter and an output voltage of next OR circuit 01 is put into the other AND circuit A1. The output voltage V7 from the comparator 64 is input to the logic arithmetic unit 63, and is input to one of an AND circuit A2 via an inverter. An inverted signal of the output voltage of the OR circuit 01 is input to the other of the AND circuit A2. Both the output voltage of the AND circuit A1 and the output voltage of the AND circuit A2 are input to the OR circuit 01, respectively, and the output V4 from the logic arithmetic unit 63 is formed via the OR circuit 01, an inverter and a latch circuit (not shown).

The output signal V3 of the comparison unit 46 is input to the mode control unit 62 constituted the conversion gain control unit 61. The mode control unit 62 outputs the mode signal V4 corresponding to the standard power consumption mode and the low power consumption mode on the basis of the input signal V3 with continuously n pulses (n is a counting number and n equals to three in this embodiment). Further, when the input signal V7 of the comparator 64 is switched to "L" in the low power consumption mode, the mode signal V4 is defined as "L" in the standard power consumption mode.

The magnetic detection device 3 is operated as an explanation described below. FIG. 10 indicates the output signal V7 from the comparator in addition to the output signals as shown in FIGS. 5A-5G. The explanation is carried out other than that in FIG. 5.

As shown in FIG. 10E, the output signal V7 from the comparator 64 compares the amplifier output signal V2 and the reference voltage Vref3 in the low power consumption mode. When the output signal V7 is larger than the reference voltage Vref3, the output signal V7 becomes "H", and when the output signal V7 is lower than the reference voltage Vref3, the output signal V7 becomes "L". As shown in FIG. 10A, the reference voltage Vref3 is corresponded to the magnetic flux density B3 which is larger than the threshold level Bth of the magnetic flux density in the Hall element 13. When the magnetic flux density is decreased, the magnetic flux density is crossed with the magnetic flux density B3 at time T4. Time T4 is positioned just before time T1 which is a time that the magnetic flux density is crossed with the threshold level Bth. As shown in FIG. 10C, the reference voltage Vref3 is positioned between the reference voltage Vref1 and the reference voltage Vref2. The reference voltage Vref1 is corresponded to the threshold level in the standard power consumption mode, for example. The reference voltage Vref2 is corresponded to the threshold level in the low power consumption mode in the magnetic detection device 1 of the first embodiment.

As shown in FIG. 10F, the output signal V4 from the mode control unit is switched corresponding to time T4, T3 at which the output signal V2 is switched as shown in FIG. 10C. Accordingly, the output signal V4 becomes "H" in the standard power consumption mode and "L" in the low power consumption mode, both modes are output from the mode control unit 62.

As shown in FIG. 10H, a power consumption of the magnetic detection device 3 is demonstrated by the real line. The power consumption of the magnetic detection device in the standard power consumption mode 3 is the same value as that of a power consumption of the conventional magnetic detection device, and the power consumption of the magnetic detection device 3 in the low power consumption mode is lower than that of the power consumption presented by the dotted line in the standard power consumption mode. As the magnetic flux density B3 is set to be larger than the threshold level Bth of the magnetic flux density, the power consumption of the magnetic detection device 3 is shifted from the low power consumption mode to the standard power consumption mode at time T4 immediately before time T1. Another operations is retained as the same as the operations in the first embodiment.

as mentioned above, switching timing from the low power consumption mode to the standard power consumption mode in the magnetic detection device 3 is designed by introducing the reference voltage Vref3 corresponding to the magnetic flux density B3 which is larger than the threshold level Bth of the magnetic flux density.

The time of the low power consumption mode in the magnetic detection device 3 is set to be shorter than that in the first embodiment, as the timing is in ahead from time T1 to time T4. A ratio of the low power consumption to the standard power consumption mode in the magnetic detection device 3 is lower than that of the first embodiment in the magnetic detection device 1. However, the power can be switched from the low power consumption mode to the standard power consumption mode consumption in high detection sensitivity, as the reference voltage Vref3 is larger than the reference voltage Vref2. Consequently, switching can be reliably performed. Another effect other than the effect mentioned above, the magnetic detection device 3 includes the same effects as the magnetic detection device 1 in the first embodiment.

(Fourth Embodiment)

A magnetic detection device according to a fourth embodiment will be described below in detail with reference to FIGS. 11-12. A different point from the magnetic detection device of the third embodiment is that a magnetic sensor control unit is constituted with a Hall element control unit. Throughout the attached drawings, similar or same reference numerals with the first embodiment show similar, equivalent or same components.

Figure 11:
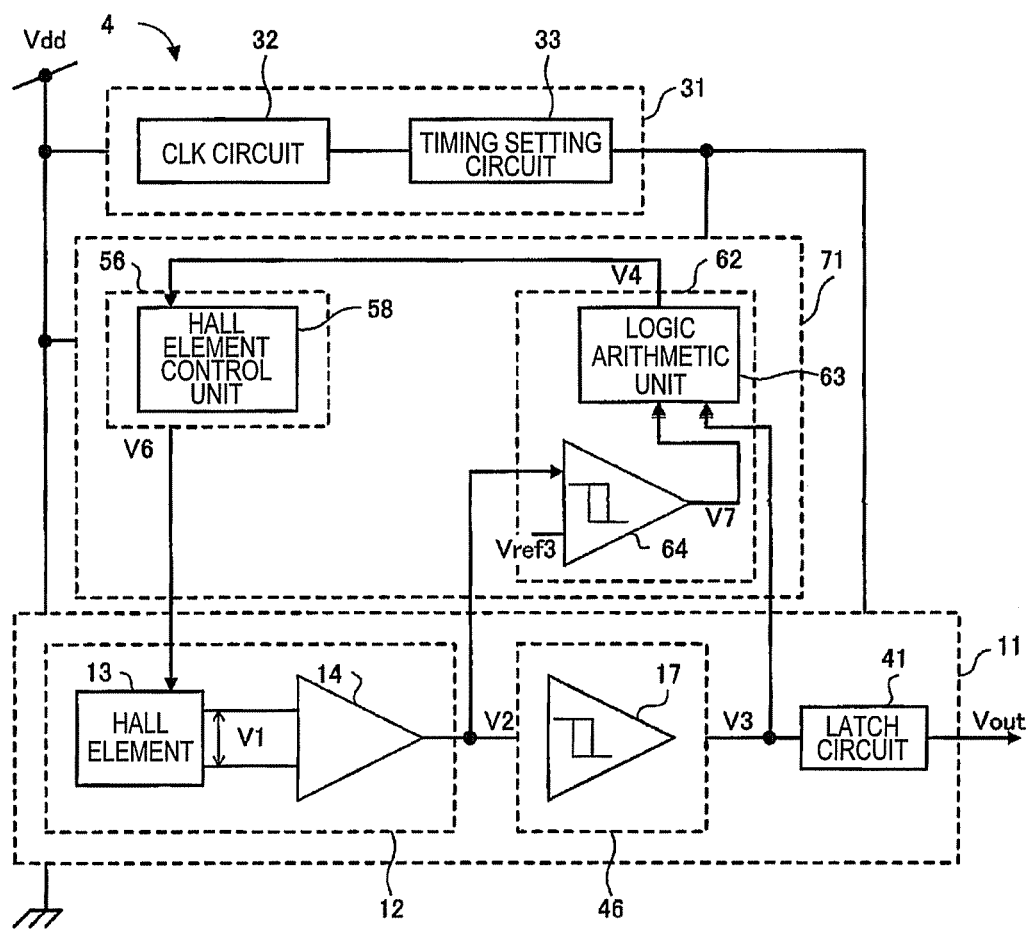
FIG. 11 is a block diagram schematically showing a constitution of a magnetic detection device in a fourth embodiment.

As shown in FIG. 11, a magnetic detection device 4, in a constitution of the magnetic detection device 3 in the third embodiment, the magnetic sensor control unit 56 is constituted with a Hall element control unit 58. A relation between the magnetic sensor control unit 56, the mode control unit 62, the Hall element 13 and the amplifier 14 is the same as that between of the magnetic sensor control unit 56, the mode control unit 22, the Hall element 13 and the amplifier 14 of the magnetic detection device 2 in the second embodiment. The constitution of the magnetic detection device 4 other than the units mentioned above is the same as the magnetic detection device of the third embodiment.

An operation of the magnetic detection device 4 is explained. The magnetic detection device 4 in FIG. 12 includes characteristics as the same as those of the magnetic detection device 3 in FIG. 10, however, an output voltage V1 of the Hall element in FIG. 12B is different from characteristics in FIG. 10. Therefore, it is explained with avoiding repetition in a description of FIG. 10.

Figure 12:
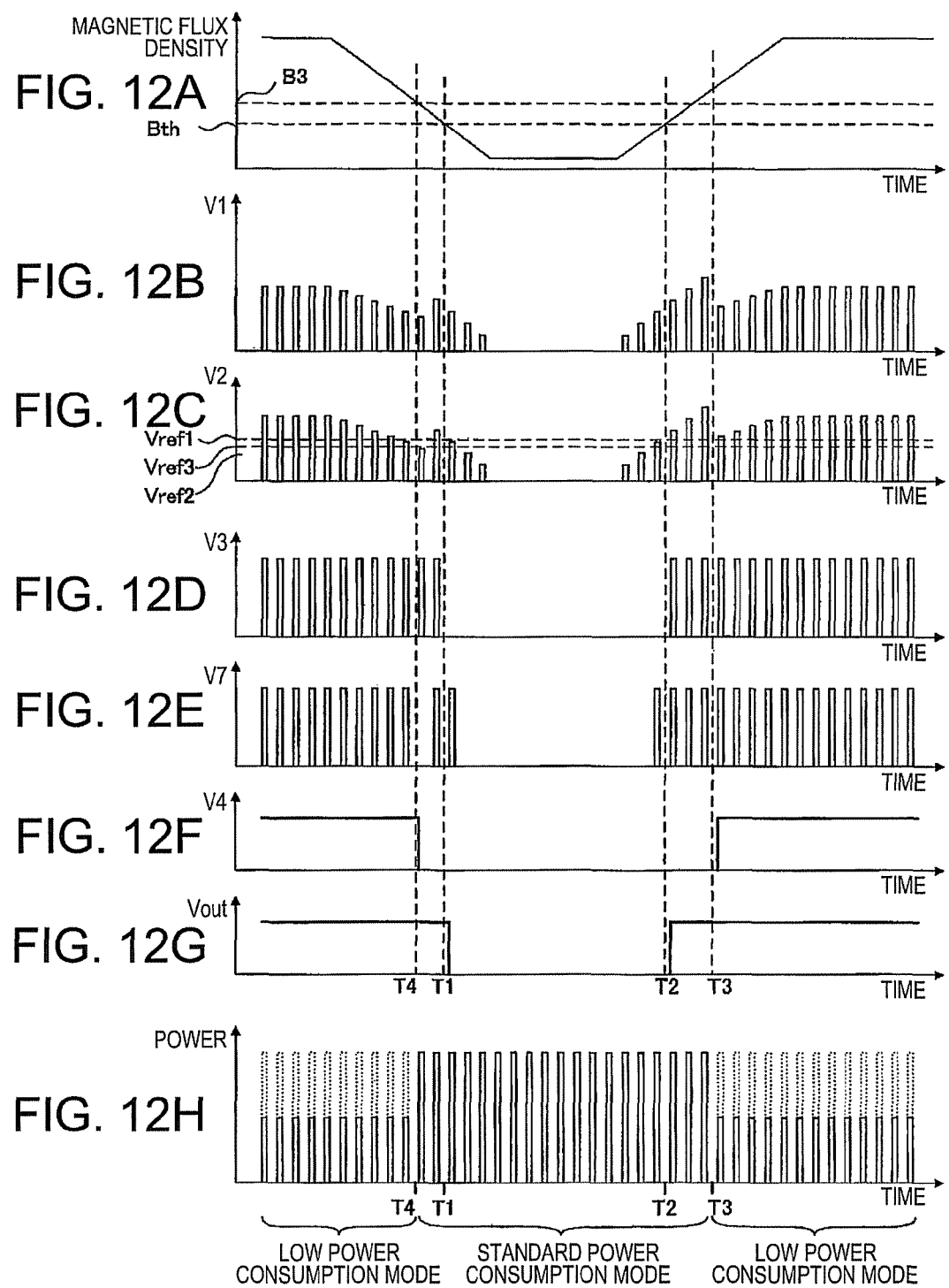
FIGS. 12A-12H are diagrams schematically showing a time dependence of consumption power and operations of the magnetic detection device in the fourth embodiment.

As shown in FIG. 12B, when the magnetic flux density is constant, the output V1 of the Hall element 13 can be suppressed at a lower voltage corresponding to suppressing the electrical current provided to be relatively low in the low power consumption mode. On the other hand, the output voltage V1 of the Hall element 13 can be increased as a higher voltage corresponding to heightening the electrical current provided to be relatively high in the standard power consumption mode. The output V1 becomes lower than the reference voltage Vref3 at time T4 or immediately after time T4 in the low power consumption mode. Successively, the Hall element 13 is put into the standard power consumption mode. In other words, Hall element 13 is switched to relatively large electrical current to output larger voltage. In the standard power consumption mode, the output V1 is set to be the same value as that of the magnetic detection device 2 in the second embodiment. Another characteristic in FIG. 12 is the same as those of the magnetic detection device 3 in the third embodiment.

As mentioned above, the magnetic detection device 4 has the same effect as the magnetic detection device 3, as the electrical current of the Hall element 13 can be controlled as the standard power consumption mode or the low power consumption mode.

The magnetic detection device 4 is demonstrated as the magnetic sensor control unit 56 which is constituted with the Hall element control unit 58. On the other hand, the magnetic sensor control unit 56 can includes both the amplifier in the control unit 27 in the magnetic detection device and the Hall element control unit 58.

(Fifth Embodiment)

A magnetic detection device according to a fifth embodiment will be described below in detail with reference to FIGS. 13-16. A different point from the magnetic detection device of the third embodiment is that the mode control unit does not use the output of the amplifier. Throughout the attached drawings, similar or same reference numerals with from the first embodiment to the fourth embodiment show similar, equivalent or same components.

Figure 13:
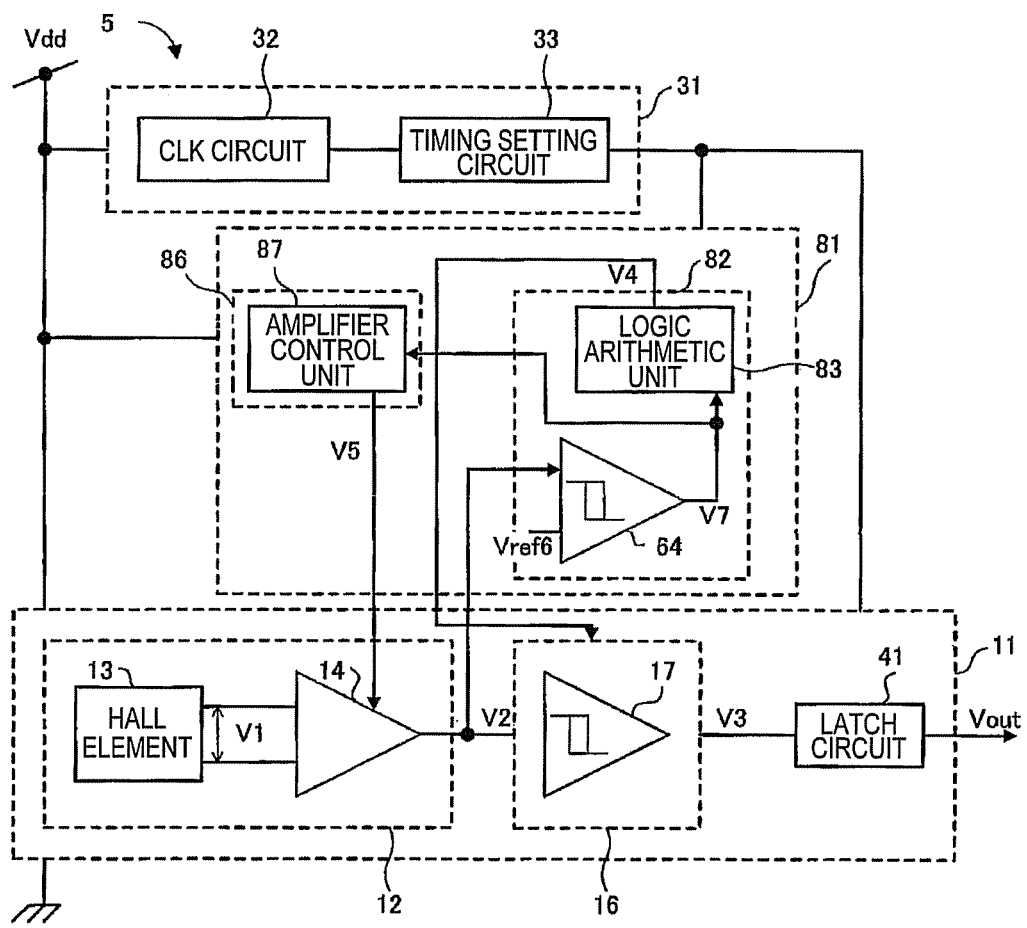
FIG. 13 is a block diagram schematically showing a constitution of a magnetic detection device in a fifth embodiment.

As shown in FIG. 13, the magnetic detection device 5 includes a modified conversion gain control unit 81 to the constitution of the magnetic detection device 3 in the third embodiment, and includes the comparison unit 16 which is the same unit in the first embodiment. In other words, a mode control unit 82 of the conversion gain control unit 81 includes a comparator 64 and a logic arithmetic unit 83. The comparator 64 is input the output voltage V2 from the amplifier 14 and the reference voltage Vref6, and outputs the output voltage V7. The logic arithmetic unit 83 is input the output voltage V7 from the comparator 64, and outputs the output voltage V4. The output voltage from the comparator 64 is input to an amplifier control unit 87 of a magnetic sensor control unit 86. The output voltage V4 from the mode control unit 82 is input to the comparison unit 16. As the comparison unit 16 has not necessarily the same voltage as the first embodiment and the second embodiment in spite of having the reference voltages Vref1, Vref2 as shown in FIG. 3, the reference voltages are respectively defined as reference voltages Vref4, Vref5. The constitution of the magnetic detection unit 11 and the intermittent operation control unit 31 other than the reference voltage is the same as that of the magnetic detection device 1 in the first embodiment. As the reference voltage Vref3 which is input to the comparator 64 is not necessarily the same voltage, the reference voltage is defined as a reference voltage Vref6 as shown in FIG. 8.

Figure 14:
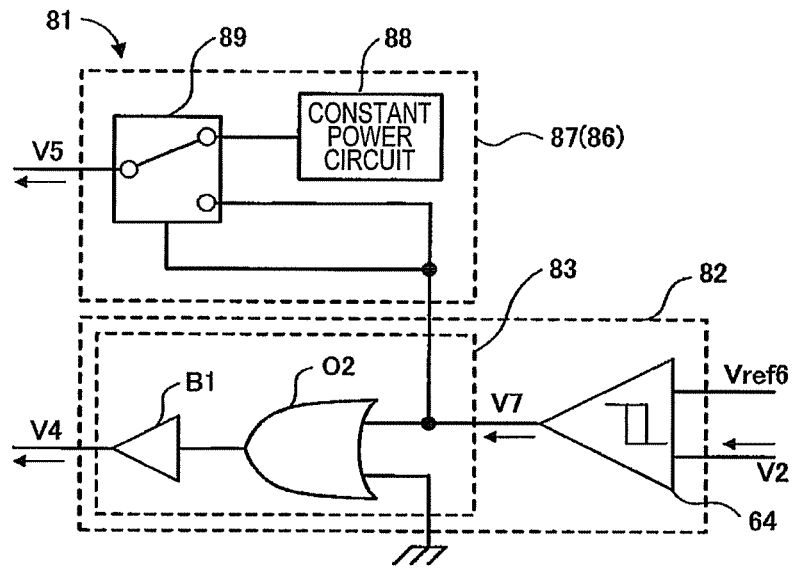
FIG. 14 is a block diagram schematically showing a constitution of a conversion gain control unit in the magnetic detection device in the fifth embodiment.

As shown in FIG. 14, the reference voltage Vref3 and the output voltage V2 of the amplifier 14 are input to the comparator 64 of the mode control unit 82, and outputs the output voltage V7 to the logic arithmetic unit 83. The logic arithmetic unit 83 includes an OR circuit O2 which has one input signal output from the comparator 64 and the other input signal from ground potential. The OR circuit O2 outputs the mode signal V4 via a buffer circuit B1 and a latch circuit (not shown).

An amplifier control unit 87 of the magnetic sensor control unit 86 selects one of the output voltage of V7 from the comparator 64 and the output voltage from the constant power circuit 88 to output as a gain selection signal V5. In other words, the output voltage of the comparator 64 is input to a switch 89 for switching as a signal, and one of the output voltage V7 from the comparator 64 and the output voltage from the constant power circuit 88 is selected by the switch 89. As a result, the gain control signal V5 is output. The output voltage V7 from the comparator 64 and the output voltage V5 from the constant power circuit 88 are designed to be applied as a gain control voltage of the amplifier 14. An input signal of the comparator 64 is nearly the same as that of the comparator 17, however, the output level is different.

Figure 15:
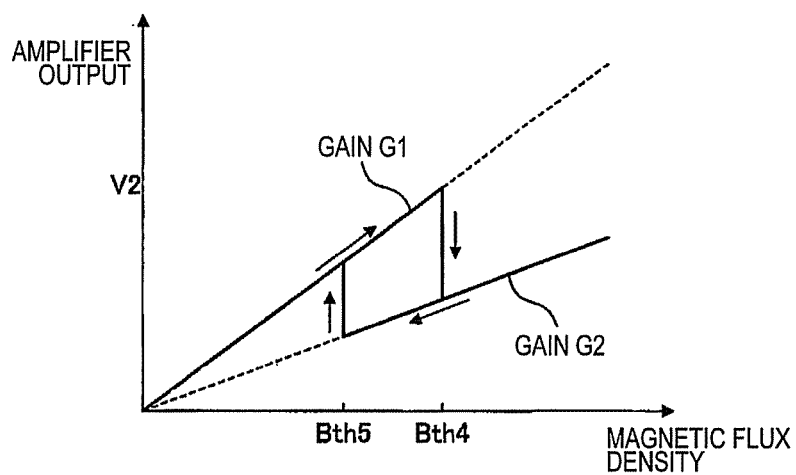
FIG. 15 is a diagram schematically showing an output voltage of an amplifier in the fifth embodiment.

As shown in FIG. 15, the magnetic flux density is set in the horizontal axis, and the output voltage V2 of the amplifier 14 which is driven by switching two gains is set in the vertical axis. As shown in FIG. 15, the output voltage V2 of the amplifier 14 is proportional to the magnetic flux density, and is controlled to be set relatively high gain G1 or relatively low gain G2 due to the gain control signal V5. The gain G1 and the gain G2 are corresponding to the standard power consumption mode and the low power consumption mode, respectively. When in the gain G1, the magnetic flux density is increased from the smaller value than the threshold level to attain a threshold level Bth4 corresponding to the magnetic flux density of the reference voltage Vref4, the output voltage of the amplifier 14 is switched from the gain G1 to the gain G2 to be increased. When the magnetic flux density is decreased from a larger value than the threshold level in the gain G2, and attains to the threshold level Bth5 of the magnetic flux density corresponding to the reference voltage Vref5, the output voltage from the amplifier is switched from the gain G2 to the gain G1 to be decreased.

In other words, when the output voltage V2 from the amplifier 14 is lowered to the voltage defined by the reference voltage Vref 6, the output voltage V7 from the comparator 64 outputs "L", and the output voltage V4 from the mode control unit 82 outputs "L", so that the output voltage V2 is switched from the gain G2 to the gain G1. In the gain G2, a voltage from a constant power circuit 88 is connected to the amplifier control unit 87 and outputs as the output voltage V5. In the gain G1, the output voltage from the comparator 64 is directly connected to amplifier control unit 87 as the output voltage V5. Here, the reference voltage of the comparator 17 in FIG. 13 is controlled, and the reference voltage Vref2 in the conventional consumption mode is selected.

When the output voltage V2 of the amplifier 14 is over the voltage value defined by the reference voltage Vref6, the output voltage V7 from the comparator 64 outputs "H", the output voltage V4 from the mode control unit 82 is output "H", so that the output voltage V4 is switched from the gain G2 to the gain G1. Here, the reference voltage of the comparator 17 in FIG. 13 is controlled, and the reference voltage Vref1 in the conventional consumption current mode is selected.

Figure 16:
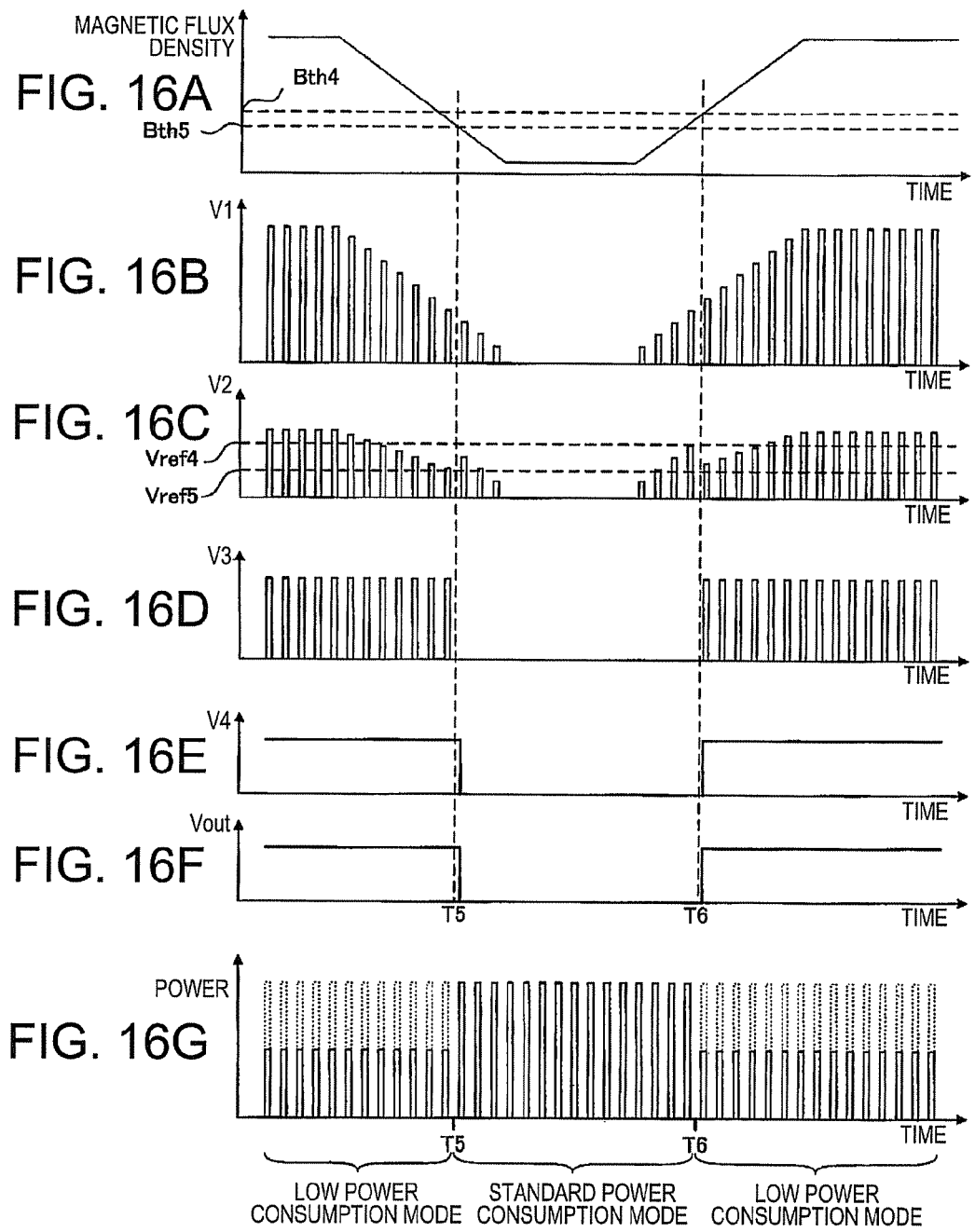
FIGS. 16A-16G are diagrams schematically showing a time dependence of consumption power and operations of the magnetic detection device in the fifth embodiment.

An operation of the magnetic detection device 5 is explained. The magnetic detection device 5 in FIG. 16 includes characteristics as the same as those of the magnetic detection device 3 in FIGS. 5A-5G. Therefore, it is explained with avoiding repetition in a description of FIG. 5. As shown in FIG. 16A, the magnetic flux density of the Hall element 13 is set at threshold level Bth4 in the increasing mode and at the threshold level Bth5 in the decreasing mode. The threshold level Bth4 is larger than the threshold level Bth5. A crossing point between the threshold level Bth5 and the magnetic flux density in the decreasing mode is defined as time T5, and a crossing point between the threshold level Bth4 and the magnetic flux density in the increasing mode is defined as time T6.

As shown in FIG. 16C, threshold level Bth4 is corresponding to the reference voltage Vref4, and the threshold level Bth5 is corresponding to the reference voltage Vref5. As shown in FIG. 16E, output voltage V4 of the mode control unit is shifted from "H" to "L" at time T5 or immediately after T5, and is shifted from "L" to "H" at time T6 or immediately after T6. As shown in FIG. 16F, the output voltage Vout of the magnetic detection device 5 becomes as the same output voltage mode as the control unit output V4.

As shown in FIG. 16G, the power consumption of the magnetic detection device 5 becomes the power consumption as indicated by the real line. In the standard power consumption mode, the power consumption of the magnetic detection device 5 becomes the same as power consumption of a conventional standard. In the low power consumption mode, the power consumption of the magnetic detection device 5 is lower than the power consumption indicated by the dotted line in the standard power consumption mode.

The magnetic detection device 5 including the constitution mentioned above is set to be in the standard power consumption mode when the magnetic flux density is lower than the threshold levels Bth4, Bth5, and is set to be in the low power consumption mode when the magnetic flux density is higher than the threshold levels Bth4, Bth5. When the magnetic flux density is increased from a smaller value than the threshold levels Bth4, Bth5 to the threshold level Bth4 of the magnetic flux density corresponding to the reference voltage Vref4, the output voltage from the amplifier 14 is shifted in the low power consumption mode. The magnetic flux density is decreased from a larger value than the threshold levels Bth4, Bth5 to threshold level Bth5 of the magnetic flux density corresponding to the reference voltage Vref5, the output voltage from the amplifier 14 is shifted in the standard power consumption mode. The magnetic detection device 5 having a different constitution from the magnetic detection device 1 in the first embodiment can obtain the same effect as the magnetic detection device 1.

(Sixth Embodiment)

A magnetic detection device according to a sixth embodiment will be described below in detail with reference to FIG. 17. A different point from the magnetic detection device of the fifth embodiment is that the magnetic sensor control unit is constituted with a Hall element control unit. Throughout the attached drawings, similar or same reference numerals with from the first embodiment to the fifth embodiment show similar, equivalent or same components.

Figure 17:
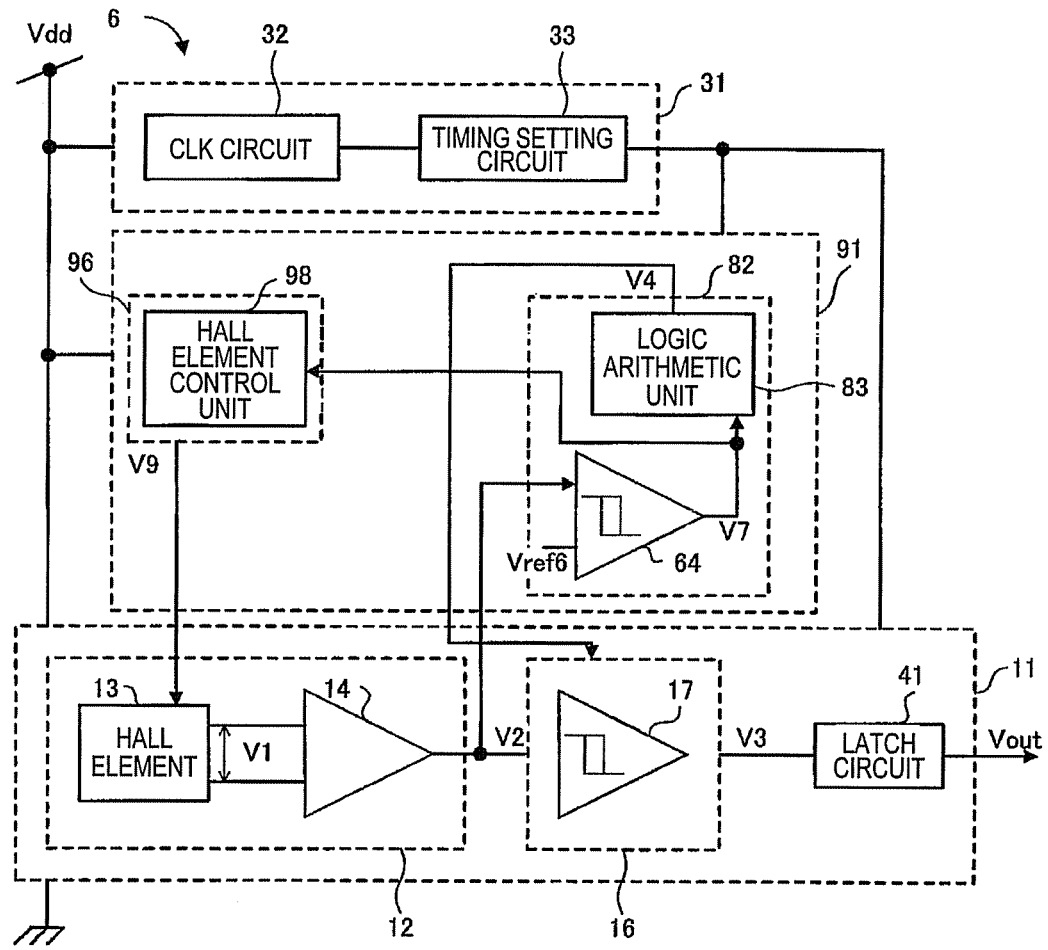
FIG. 17 is a block diagram schematically showing a constitution of a magnetic detection device in a sixth embodiment.

As shown in FIG. 17, a Hall element control unit 98 is provided in a magnetic sensor control unit 96 of a magnetic detection device. The Hall element control unit 98 is corresponding to input signal V7 from the mode control unit 82, and outputs a Hall element control signal V6 which controls electrical current provided to the Hall element 13. When the input signal of the mode control unit 82 is "L", the Hall element control unit 98 becomes as the standard power consumption mode to be set to relatively heighten electrical current provided to the Hall element 13. When the input signal is "H", the Hall element control unit 98 becomes as the low power consumption mode to be set to relatively lower electrical current provided to the Hall element 13.

The amplifier control unit 87 provided in the magnetic detection device 5 is omitted in the magnetic detection device 6, and the amplifier 14 has a constant gain, for example, which is set as operating the gain G1. Another operations is retained as the same as the operations in the fifth embodiment.

An operation of the magnetic detection device 6 in the sixth embodiment is determined on the basis of the operation of the magnetic detection device in the fifth embodiment, as similarly, the operation of the magnetic detection device 2 in the second embodiment is determined on the basis of the operation of the magnetic detection device 1 in the first embodiment. The consumption current of the Hall element 13 is the same consumption current as a conventional standard in the standard power consumption mode, is lower consumption current than that of the standard power consumption mode in the low power consumption mode. The lower consumption current is lead to lower the consumption power.

The electrical current of the Hall element 13 in the magnetic detection device 6 is controlled as the standard power consumption mode or the low power consumption mode, and has the same effects as the magnetic detection device 5.

The magnetic sensor control unit 96 in the magnetic detection device 6 is constituted with the Hall element control unit 98. However, the magnetic sensor control unit 96 can be constituted with the both amplifier control unit 87 in the magnetic detection device 5 and the Hall element control unit 98.

Other embodiments of the present disclosure will be apparent to those skilled in the art from consideration of the specification and practice of the disclosure disclosed herein. It is intended that the specification and example embodiments be considered as exemplary only, with a true scope and spirit of the disclosure being indicated by the claims that follow. The disclosure can be carried out by being variously modified within a range not deviated from the gist of the disclosure.

What is claimed is:

1. A magnetic detection device, comprising:
a magnetic detection unit including a magnetic sensor unit and a comparison unit, the magnetic sensor unit detecting a magnetic flux density as a detection signal in magnetic field, amplifying the detection signal and outputting an output signal to the comparison unit as a mode selected from one of a first mode and a second mode of which power consumption is lower than power consumption of the first mode, the comparison unit comparing the output signal and a reference voltage as a threshold level which determines magnetic field being formed or not, and outputting a comparison result;
a conversion gain control unit including a mode control unit and a magnetic sensor control unit, the mode control unit being input the comparison result and outputting a mode signal based on the comparison result to the magnetic sensor control unit, the magnetic sensor control unit outputting an output signal to the magnetic sensor unit as the second mode when the mode signal is larger than the threshold level or the first mode when the mode signal is smaller than the threshold level so as to control the magnetic sensor unit; and an intermittent operation control unit controlling the magnetic detection unit and the conversion gain control unit to enable to intermittently operate.

2. The magnetic detection device of claim 1, wherein the comparison unit compares one reference voltage selected from a first reference voltage corresponding to the threshold level in the first mode and a second reference voltage corresponding to the threshold level in the second mode and the output signal of the magnetic sensor unit.

3. The magnetic detection device of claim 2, wherein the comparison unit includes a first comparator and a switch switching between the first reference voltage and the second reference voltage in accordance with the mode signal, the switch is connected to one terminal of the first comparator and the amplifier is connected to the other terminal of the first comparator.

4. The magnetic detection device of claim 1, wherein the mode control unit includes a logic arithmetic unit which is continuously input intermittent signals with a predetermined period from the comparison unit and outputs the mode signal for selecting the reference voltage based on the intermittent input signals to the comparison unit.

5. The magnetic detection device of claim 4, wherein the predetermined period is determined by a number of the intermittent input signals.

6. The magnetic detection device of claim 1, wherein the magnetic sensor unit includes a Hall element and an amplifier, the Hall element outputs the detection signal to the amplifier corresponding to strength of the magnetic field, and the amplifier amplifies the detection signal.

7. The magnetic detection device of claim 1, wherein the magnetic sensor control unit includes an amplifier control unit which is set as the first mode or the second mode corresponding to the mode signal, and is set up gain of the amplifier to relatively high in the first mode or to relatively low in the second mode, respectively.

8. The magnetic detection device of claim 1, wherein the magnetic sensor control unit includes a Hall element control unit which is set as the first mode or the second mode corresponding to the mode signal, and is set up electrical current or voltage of the Hall element to relatively high in the first mode or to relatively low in the second mode, respectively.

9. The magnetic detection device of claim 1, wherein the intermittent operation control unit includes a clock circuit and a timing setting circuit, the clock circuit generates a clock signal, the timing setting circuit divides frequency of the clock signal so as to output an output signal with a predetermined cycle to the magnetic detection unit and the conversion gain control unit.

10. The magnetic detection device of claim 1, wherein the mode control unit includes a second comparator, the second comparator inputs the output signal of the magnetic sensor unit, and compares the output signal of the magnetic sensor unit and a third reference voltage which is set between the first reference voltage corresponding to the threshold level at the first mode and the second reference voltage corresponding to the threshold level at the second mode so as to output a comparison result to the mode control unit, and the mode control unit outputs the mode signal to the magnetic sensor control unit based on the comparison result of the second comparator and the intermittent input signals of the comparison unit.

11. The magnetic detection device of claim 10, wherein the magnetic sensor control unit includes the amplifier control unit which is set as the first mode or the second mode corresponding to the mode signal, and is set up gain of the amplifier to relatively high in the first mode or to relatively low in the second mode, respectively.

12. The magnetic detection device of claim 10, wherein the magnetic sensor control unit includes the Hall element control unit which is set as the first mode or the second mode corresponding to the mode signal, and is set up electrical current or voltage of the Hall element to relatively high in the first mode or to relatively low in the second mode, respectively.

13. The magnetic detection device of claim 10, wherein the mode control unit outputs the mode signal for selecting the reference voltage to the comparison unit based on the comparison result of the second comparison unit and outputs the comparison result to the magnetic sensor control unit, the magnetic sensor control unit includes a constant voltage circuit and selects one of an output signal of the constant voltage circuit and the comparison result of the second comparison unit, and inputs as a selection signal to the amplifier.

14. The magnetic detection device of claim 13, wherein the magnetic sensor control unit includes the amplifier control unit which is set as the first mode or the second mode corresponding to the selection signal, and is set up gain of the amplifier to relatively high in the first mode or to relatively low in the second mode, respectively.

15. The magnetic detection device of claim 13, wherein the magnetic sensor control unit includes the Hall element control unit which is set as the first mode or the second mode corresponding to the selection signal, and is set up electrical current or voltage of the Hall element to relatively high in the first mode or to relatively low in the second mode, respectively.

\* \* \* \* \*